(12) United States Patent
Sakurada et al.

(10) Patent No.: US 8,385,117 B2
(45) Date of Patent: Feb. 26, 2013

(54) SEMICONDUCTOR MEMORY DEVICE AND DECODING METHOD

(75) Inventors: Kenji Sakurada, Kanagawa (JP); Hironori Uchikawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/233,530

(22) Filed: Sep. 15, 2011

(65) Prior Publication Data

US 2012/0224420 A1 Sep. 6, 2012

(30) Foreign Application Priority Data

Mar. 2, 2011 (JP) ................................. 2011-045477

(51) Int. Cl.
*G11C 16/04* (2006.01)
(52) U.S. Cl. .......... 365/185.03; 365/185.18; 365/185.23
(58) Field of Classification Search ............. 365/185.03, 365/185.18, 185.23, 285.24, 189.07, 189.15
See application file for complete search history.

(56) References Cited

U.S. PATENT DOCUMENTS

| | | | |
|---|---|---|---|
| 7,794,480 B2 * | 9/2010 | Gordon et al. ................. 606/257 |
| 7,818,653 B2 * | 10/2010 | Brandman et al. ............ 714/794 |
| 7,872,910 B2 * | 1/2011 | Honma et al. ............ 365/185.03 |
| 7,975,192 B2 | 7/2011 | Sommer et al. |
| 8,032,810 B2 * | 10/2011 | Ishikawa et al. ............... 714/754 |
| 8,149,623 B2 * | 4/2012 | Uchikawa et al. ........ 365/185.18 |
| 2008/0055990 A1 | 3/2008 | Ishikawa et al. |
| 2009/0201726 A1 | 8/2009 | Honma et al. |
| 2010/0223538 A1 | 9/2010 | Sakurada |
| 2011/0038212 A1 | 2/2011 | Uchikawa et al. |
| 2011/0085382 A1 * | 4/2011 | Lee et al. .................. 365/185.18 |
| 2011/0225472 A1 | 9/2011 | Sommer et al. |
| 2011/0292724 A1 * | 12/2011 | Kim .......................... 365/185.03 |
| 2012/0008389 A1 * | 1/2012 | Kim .......................... 365/185.03 |

FOREIGN PATENT DOCUMENTS

WO WO 2008/053472 5/2008

* cited by examiner

*Primary Examiner* — Gene Auduong
(74) *Attorney, Agent, or Firm* — Oblon, Spivak, McClelland, Maier & Neustadt, L.L.P.

(57) ABSTRACT

A memory card decodes three bits of data stored in one memory cell and belonging to different pages, each being a unit of reading, by iterative calculation using probability based on eight threshold voltage distributions. The memory card includes a word line controlling section configured to select one required to read 1-bit data belonging to one of the pages to be read from among seven voltage sets which are composed of seven reference voltages for hard bit reading and a plurality of intermediate voltages for soft bit reading and perform control to apply the voltages of the selected voltage set as read voltages to the memory cell, a log likelihood ratio table storing section, and a decoder configured to decode read data using a log likelihood ratio.

19 Claims, 8 Drawing Sheets

SEMICONDUCTOR MEMORY DEVICE AND DECODING METHOD

CROSS-REFERENCE TO RELATED APPLICATION

This application claims the benefit of Japanese Application No. 2011-045477 filed in Japan on Mar. 2, 2011, the contents of which are incorporated herein by this reference.

FIELD

Embodiments described herein relate generally to a semiconductor memory device configured to perform decoding by iterative calculation based on probability and a decoding method by iterative calculation based on probability.

BACKGROUND

Developments associated with encoding and decoding of digital data using an error-correcting code are being performed in the communications field, in the broadcasting field, and in the field of storages such as semiconductor memories.

Error-correcting codes can be broadly divided into codes to be subjected to algebraic hard-decision decoding and codes to be subjected to soft-decision decoding by iterative calculation based on probability.

In hard-decision decoding, when a threshold voltage corresponding to an amount of electric charge injected into a charge accumulation layer of a memory cell is applied to a word line, so-called hard bit data is read. However, memory cells have different threshold voltages even when the memory cells store same data, due to, e.g., manufacturing variations between the memory cells or conditions of the memory cells after charge accumulation. That is, threshold voltages for a plurality of memory cells storing the same data each have predetermined distributions. The reliability of data read at a voltage near a center of a peak of each threshold voltage distribution is high while the reliability of data read at a voltage near an upper limit or a lower limit of each threshold voltage distribution is low.

In soft-decision decoding, decoding is performed by iterative calculation using probability on a basis of soft bit read data read by applying intermediate voltages higher and lower than a hard bit read voltage.

Low density parity check codes (hereinafter referred to as "LDPC codes") belonging to a group of codes to be subjected to soft-decision decoding are attracting attention. LDPC codes were first proposed by R. G. Gallager in 1963. After that, excellent performance approaching the Shannon limit that is a theoretical limit of code performance has been reported with an increase in a code length of an LDPC code.

For semiconductor memory devices having a NAND semiconductor memory section, storage of a plurality of bits of data in one memory cell, i.e., implementation of a so-called multi-level memory contributes largely to implementation of higher-density semiconductor memory devices.

DETAILED DESCRIPTION

A semiconductor memory device according to an aspect of the present invention includes a word line controlling section configured to, when N (N is a natural number not less than 2) bits of data stored in one memory cell and belonging to different pages, each page being a unit of reading, are decoded by iterative calculation using probability based on $2^N$ threshold voltage distributions, select a voltage set required to read 1-bit data belonging to a page to be read from among $(2^N-1)$ voltage sets, each set being composed of a reference voltage for hard bit reading and a plurality of intermediate voltages including a voltage lower than the reference voltage and a voltage higher than the reference voltage for soft bit reading and perform control to apply the voltages of the selected voltage set as read voltages to the memory cell, a log likelihood ratio table storing section configured to store a log likelihood ratio based on each of the read voltages, and a decoder configured to decode data read by the read voltages which are applied by the word line controlling section using the log likelihood ratios stored in the log likelihood ratio table storing section and corresponding to the read voltages.

First Embodiment

A semiconductor memory device and a decoding method according to a first embodiment of the present invention will be described below with reference to the drawings.

Figure 1:
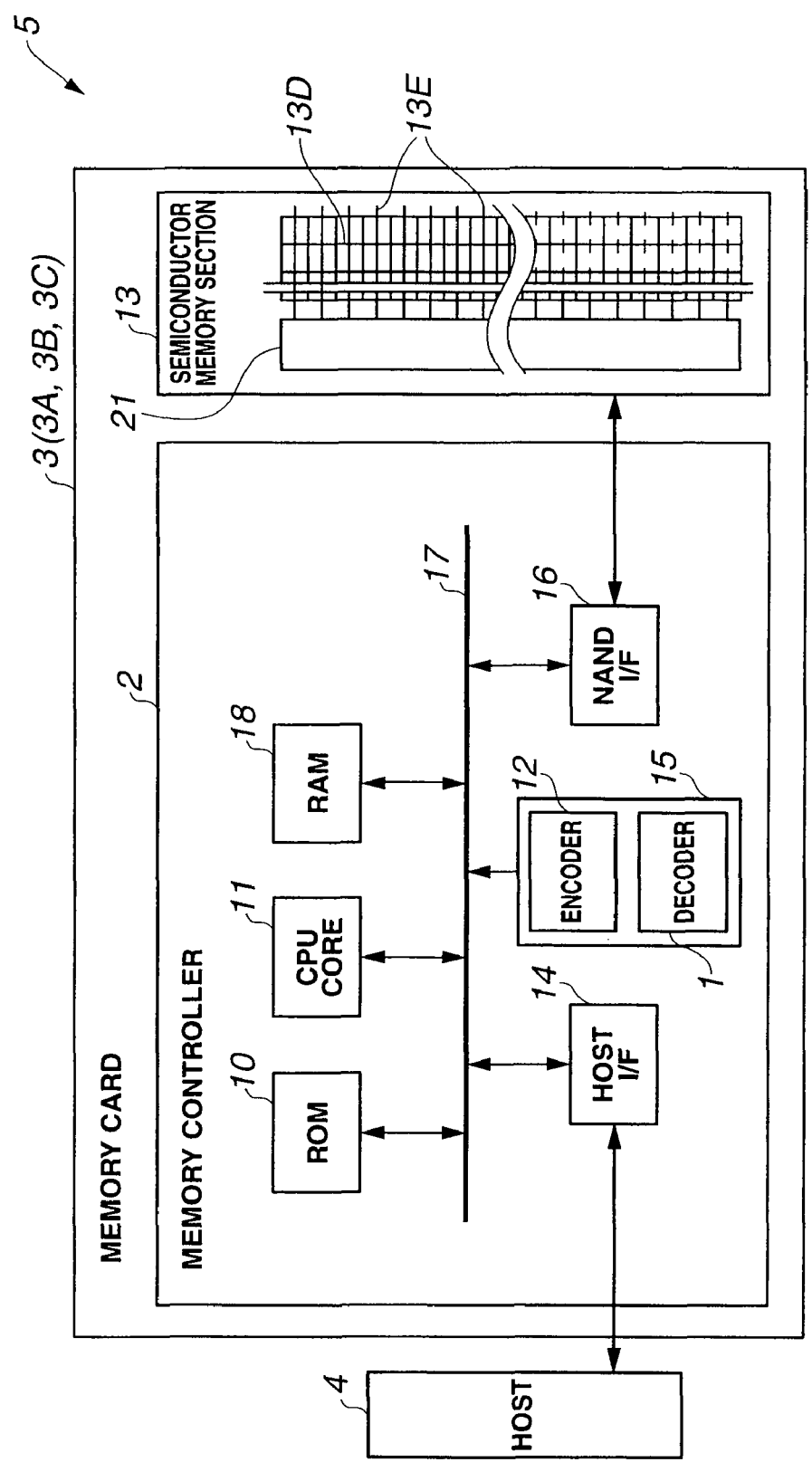
FIG. 1 is a configuration diagram showing a schematic configuration of a memory card according to a first embodiment.

As shown in FIG. 1, a memory card 3 serving as a semiconductor memory device according to the present embodiment is a storage medium configured to store data received from a host 4 such as a personal computer or a digital camera and transmit stored data to the host 4.

The memory card 3 together with the host 4 may constitute a memory system 5 for, e.g., an MP3 player which is a portable music player.

The memory card 3 includes a semiconductor memory section (hereinafter also simply referred to as a "memory section") 13 and a memory controller 2 including a decoder 1.

The memory section 13 is composed of a NAND flash memory and has a structure in which a large number of memory cells 13D serving as unit cells are connected by bit lines (not shown) used for writing, word lines 13E used for reading, and the like. Writing and reading are performed on a per-page basis, and one page is composed of a plurality of pieces of bit data. The word lines 13E are connected to a word line controlling section 21. The memory cells 13D of the memory card 3 according to the present embodiment are multi-level memory cells, each of which can store N bits (N is a natural number not less than 2) of data.

The memory controller 2 includes a ROM 10, a CPU core 11, a RAM 18, a host I/F (interface) 14, an error checking and correcting section (hereinafter referred to as an "ECC section") 15, and a NAND I/F (interface) 16, all of which are connected via a bus 17.

The memory controller 2 uses the CPU core 11 to transmit and receive data to and from the host 4 via the host I/F 14 and transmit and receive data to and from the memory section 13 via the NAND I/F 16. The memory controller 2 implements address management in the memory section 13 by an FW (firmware) run by the CPU core 11. Control of the whole memory card 3 in response to a command input from the host 4 is also performed by the FW. The ROM 10 stores a control program for the memory card 3 and the like, and the RAM 18 stores an address conversion table required for address management and the like.

The ECC section 15 includes an encoder 12 configured to generate an error-correcting code such as an LDPC code and add the error-correcting code to data when the data is stored and the decoder 1 configured to decode encoded data when the data is read. Encoding and decoding is performed on a per-ECC-frame basis, and an ECC frame is composed of a plurality of pieces of bit data. Note that a page which is a unit of writing and reading is composed of a plurality of ECC frames. The ECC section 15 of the decoder 1 according to the present embodiment uses an LDPC code which is an error-correcting code to be subjected to soft-decision decoding by iterative calculation based on probability.

Figure 2:
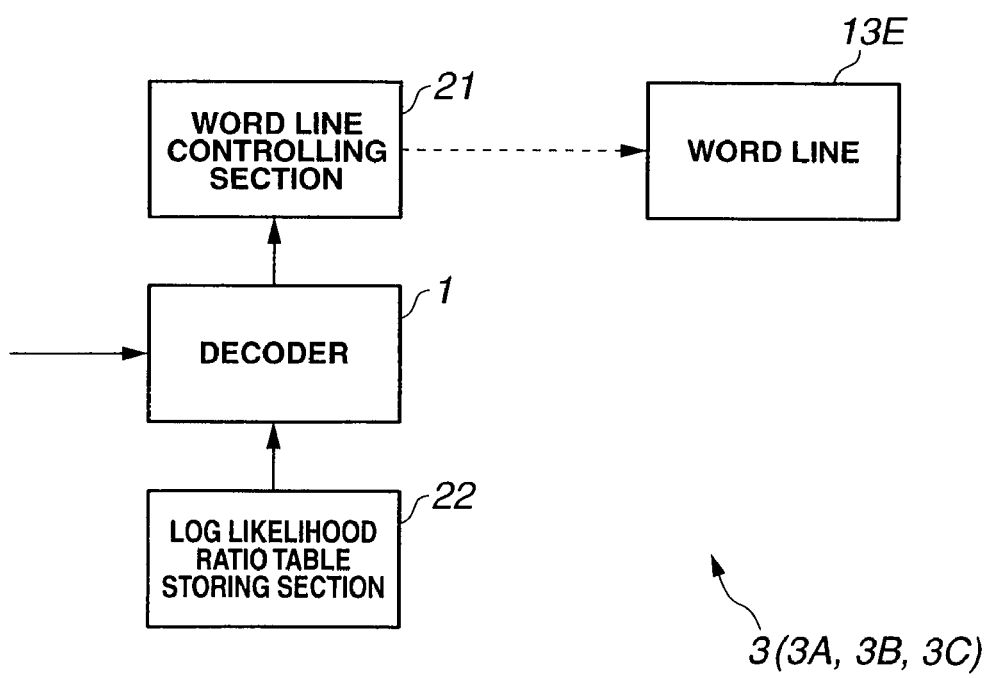
FIG. 2 is a configuration diagram showing the schematic configuration of the memory card according to the first embodiment.

As shown in FIG. 2, the memory card 3 also includes the word line controlling section 21 configured to perform control to apply voltages of a predetermined voltage set (to be described later) to the memory cells 13D via the word lines 13E, a log likelihood ratio table storing section 22 configured to store a log likelihood ratio table based on read voltages (threshold voltages), and the decoder 1 configured to perform soft-decision decoding using a log likelihood ratio.

In hard-decision decoding, an operation is performed using parity added to an ECC frame. In contrast, in decoding of data encoded with an LDPC code, hard bits (HBs) each indicating 0 or 1 and a log likelihood ratio (LLR) indicating a degree of certainty of each HB are calculated from data based on threshold voltages read by predetermined read voltages, on a basis of the log likelihood ratio table. On the basis of the LLRs, error correction processing using soft-decision decoding by iterative calculation based on probability is performed on a per-ECC-frame basis.

(Decoding in Comparative Example)

For comparison with the embodiment, decoding in a semiconductor memory device storing three bits of data (N=3) per memory cell in a comparative example will be described with reference to FIG. 3. Note that, in FIG. 3 and the like, an upper part is a schematic chart of threshold voltage distributions in which a horizontal axis represents a voltage V while a vertical axis represents an occurrence frequency, i.e., a number n of memory cells. A lower part shows a 36-level hard bit (HB) and soft bit (SB)/log likelihood ratio (LLR) table corresponding to the threshold voltage distributions of the upper part.

A Lower bit (L bit) which is a first bit to be stored first, a Middle bit (M bit) which is a second bit to be stored next, and an Upper bit (U bit) which is a third bit to be stored last are stored in each memory cell of the semiconductor memory device configured to store three bits of data per memory cell.

At a time of data reading, HB/SB reading is performed. An HB read voltage (reference voltage) is a voltage intermediate between each two adjacent ones of ($2^N$) threshold voltage distributions, and ($2^N-1$) HB read voltages are applied. That is, if N=3, as shown in FIG. 3, there are eight threshold voltage distributions (Er and A to G), and there are seven HB read voltages. The seven HB read voltages V17, V27, V07, V32, V22, V12, and V02 are applied to each memory cell in this order. More specifically, the HB read voltage V17 is one for the L bit, the HB read voltages V27 and V07 are ones for the M bit, and the HB read voltages V32, V22, V12, and V02 are ones for the U bit.

For soft-decision decoding, soft bit (SB) read voltages are applied, and a more detailed threshold voltage position is read as SBs. The SBs indicate the degrees of certainty of the HBs. As described above, the reliability of HBs read by a voltage near a peak of each of the threshold voltage distributions (Er and A to G) is high while the reliability of HBs read by a voltage near an upper limit or a lower limit of each of the threshold voltage distributions (Er and A to G), i.e., a voltage near a boundary between the one and an adjacent one of the threshold voltage distributions (Er and A to G) is low. Each SB read voltage is a voltage obtained by shifting the corresponding HB read voltage by a predetermined amount. The SBs are associated with log likelihood ratios (LLRs) indicating the reliability of the HBs on a basis of a shape of the corresponding threshold voltage distribution.

Figure 3:
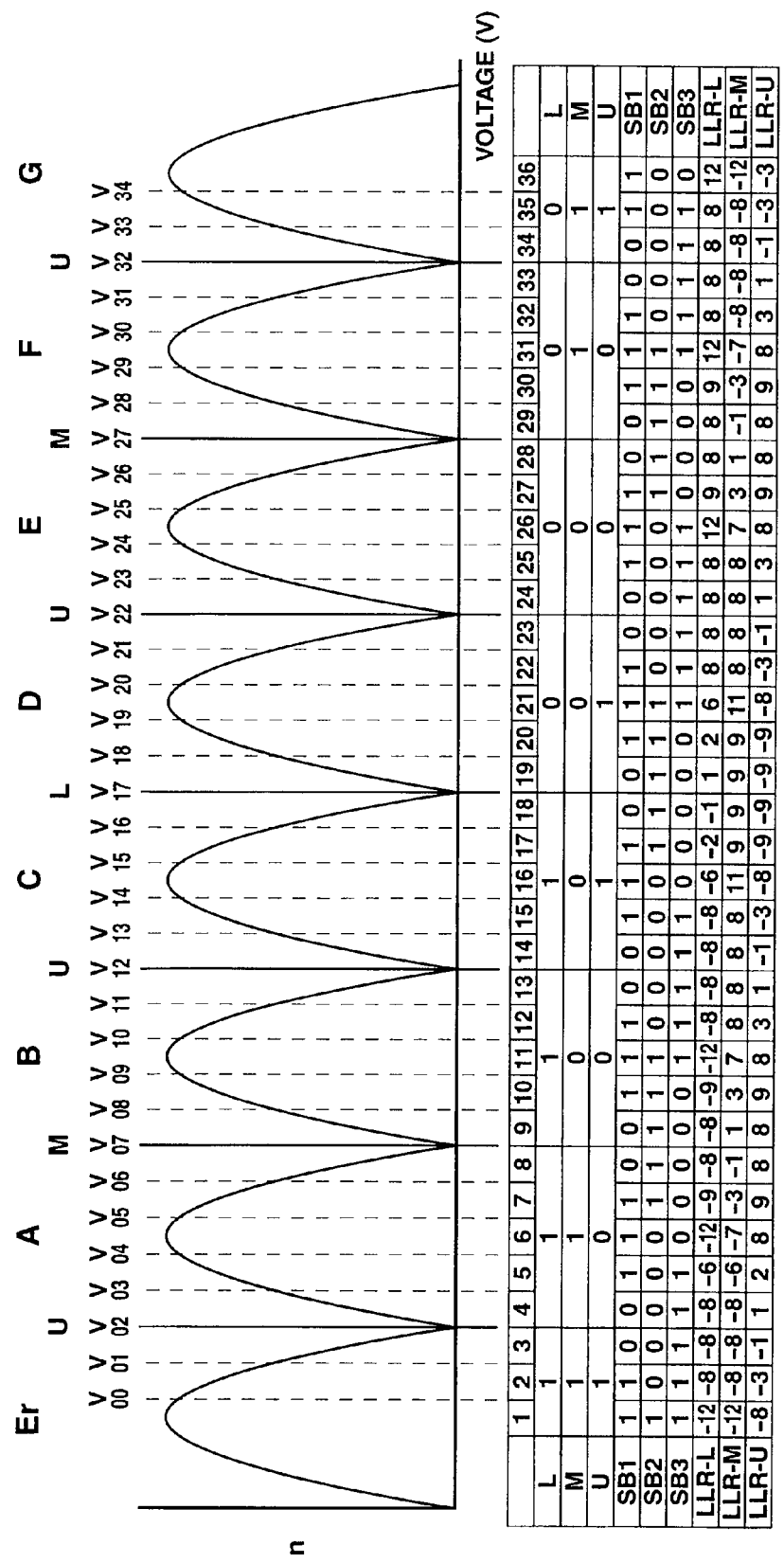
FIG. 3 is an explanatory chart showing a relationship among threshold voltage distributions, stored pieces of data, and a log likelihood ratio table for explaining soft-decision decoding in a comparative example.

As shown in FIG. 3, the soft bit read voltages are twenty-eight voltages V34, V33, V31, . . . , V01, and V00 interpolating between the HB read voltages.

By applying the seven hard bit (HB) read voltages and the twenty-eight soft bit (SB) read voltages, thirty-five read voltages in total, 6-bit data composed of HBs (L, M, and U) and SBs (SB1, SB2, and SB3) for the L bit, the M bit, and the U bit are read.

LLR values corresponding to the 6-bit data in the LLR table are used. Decoding is performed by iterative calculation using probability on a per-ECC-frame basis.

In the decoding in the comparative example, if only bit data for one of an L bit, an M bit, and a U bit stored in one memory cell is required for decoding, HBs may be used, and an HB read voltage (HB read voltages) for the bit data may be applied in hard-decision decoding. For example, only the read voltage V17 may be applied to read an HB for the L bit.

In soft-decision decoding, even if only data for one of the L bit, the M bit, and the U bit is required for the decoding, 36-level reading needs to be performed by applying the thirty-five read voltages V00 to V34 in order to acquire SBs, i.e., a shift amount from a reference voltage (HB read voltage) for a threshold voltage.

Note that, in the semiconductor device in the comparative example, voltage differences between the HB read voltages V17, V27, V07, V32, V22, V12, and V02 are equal, as shown in, e.g., FIG. 3. Voltage differences between the SB read voltages V34, V33, V31, . . . , V01, and V00 and an adjacent read voltage are also equal.

(Decoding in Memory Card According to First Embodiment)

Figure 4:
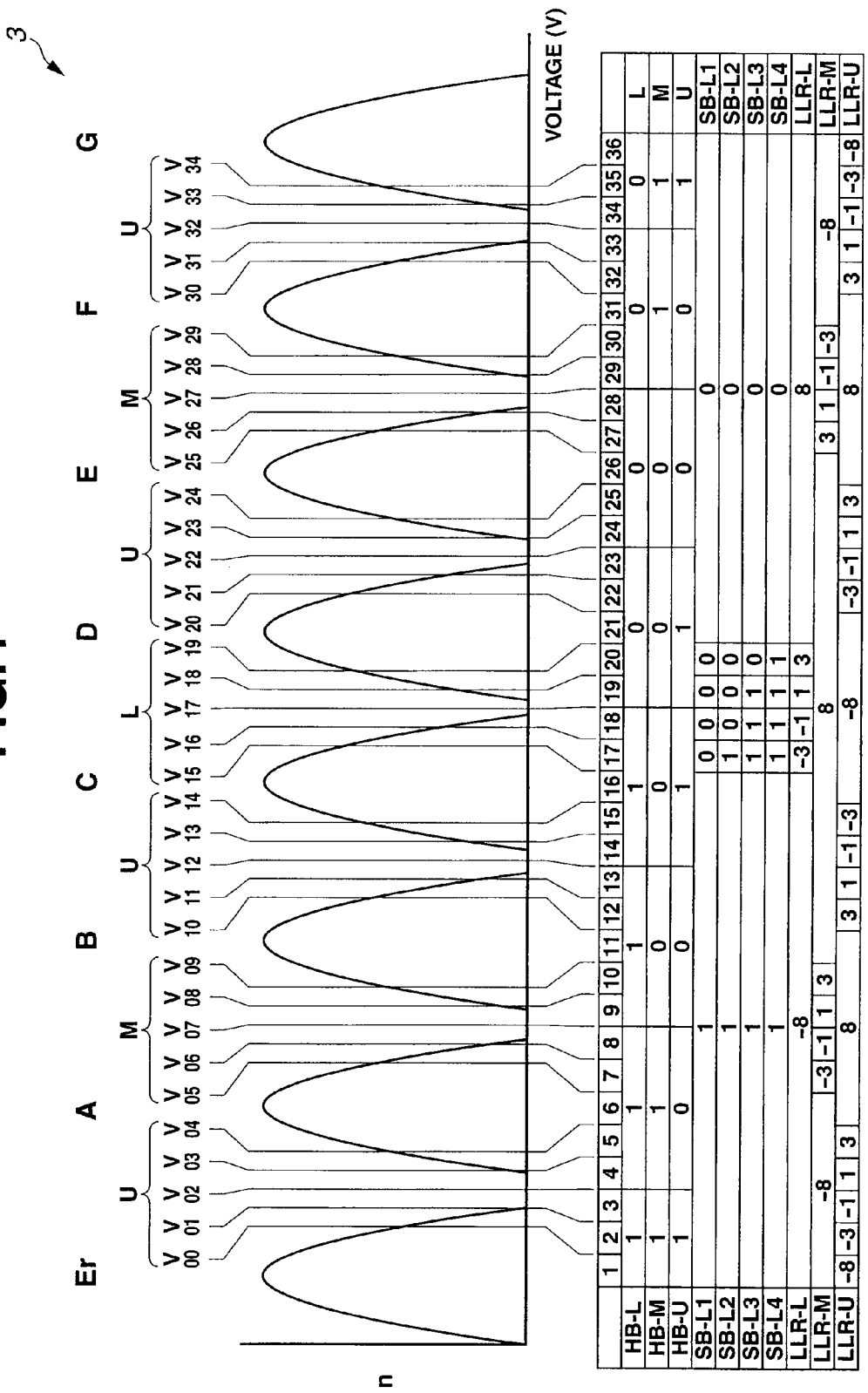
FIG. 4 is an explanatory chart showing a relationship among threshold voltage distributions, stored pieces of data, and a log likelihood ratio table for explaining soft-decision decoding in the memory card according to the first embodiment.

Like the soft-decision decoding in the comparative example, N=3 in the memory card 3 according to the present embodiment. However, three pieces of 1-bit data belonging to different pages, each being a unit of reading, are stored in each memory cell. As shown in FIG. 4, seven threshold voltage distributions (Er and A to G) of the memory card 3 are the same as in the comparative example shown in FIG. 3. Note that only SBs SB-L1 to SB-L4 for an L bit are shown and SBs for an M bit and a U bit are not shown in FIG. 4.

In the memory card 3, three bits of data stored in each memory cell need not be simultaneously read because the bits of data belong to different pages, each being a unit of reading. Only an HB and an SB for a piece of 1-bit data belonging to a page to be decoded, i.e., required for decoding are read. More specifically, in the memory card 3, HBs and SBs for the 3-bit data composed of the U bit, the M bit, and the L bit stored in each memory cell are read on a per-page basis, i.e., only an HB and an SB for 1-bit data of the 3-bit data are read at a time.

In other words, in order to decode data of a certain page, only data (an HB and an SB) for one of the U bit, the M bit, and the L bit belonging to the page to be read is read.

Figure 5:
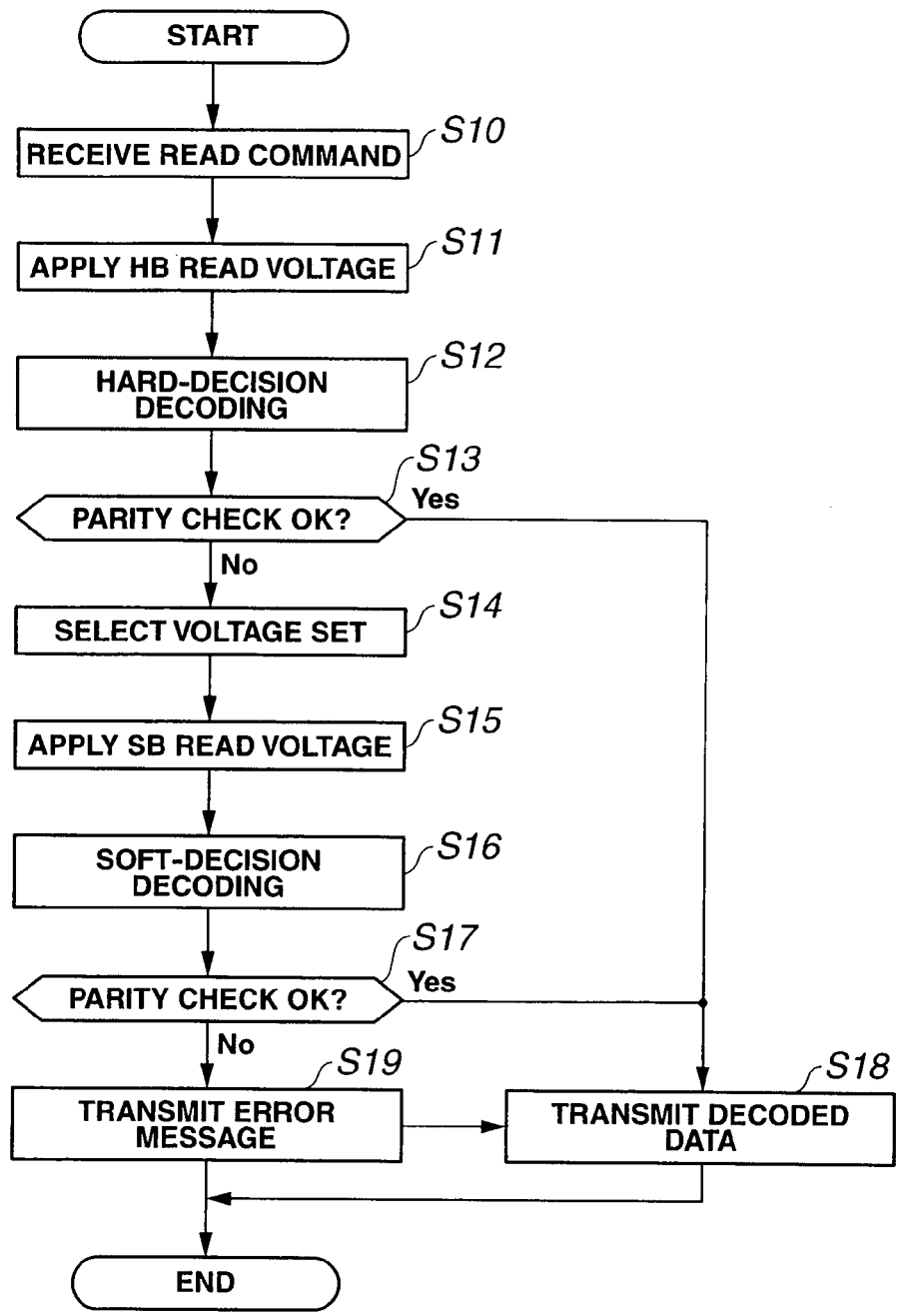
FIG. 5 is a flow chart for explaining the soft-decision decoding in the memory card according to the first embodiment.

A decoding method in the memory card 3 according to the embodiment will be described below with reference to a flow chart in FIG. 5.

<Step S10> Reception of Read Command

Decoding is started by receiving a read command from the host 4.

<Step S11> Application of HB Read Voltage

The word line controlling section 21 applies an FIB read voltage (reference voltage) for reading an HB for 1-bit data belonging to a page to be read to the memory cells. For example, to read an L bit, the HB read voltage V17 is applied to the memory cells.

<Step S12> Hard-Decision Decoding

Parity checking based on a code to be subjected to algebraic hard-decision decoding such as a Reed-Solomon code is performed using HBs for U bits belonging to a same ECC frame read from a plurality of memory cells.

<Step S13> Parity Checking

If a result of the parity checking is OK, decoded data is transmitted to the host 4 via the host I/F in S18. On the other hand, if the result of the parity checking is NG, a decoding process using a log likelihood ratio starts from S14.

<Step S14> Selection of Voltage Set

The decoder 1 selects a voltage set used for SB reading according to which one of U bits, M bits, and L bits pieces of 1-bit data belonging to the page to be read are.

As shown in FIG. 4, when L bits are to be read, a voltage set which is composed of a reference voltage V17 for HB reading and four intermediate voltages of two intermediate voltages V15 and V16 for SB reading lower than the reference voltage V17 and two higher intermediate voltages V18 and V19 is selected.

When M bits are to be read, two voltage sets of a voltage set including a voltage V27 as a reference voltage (V29, V28, V27, V26, and V25) and a voltage set including a voltage V07 as a reference voltage (V09, V08, V07, V06, and V05) are selected.

When U bits are to be read, four voltage sets of a voltage set including a voltage V32 as a reference voltage (V34, V33, V32, V31, and V30), a voltage set including a voltage V22 as a reference voltage (V24, V23, V22, V21, and V20), a voltage set including a voltage V12 as a reference voltage (V14, V13, V12, V11, and V10), and a voltage set including a voltage V02 as a reference voltage (V04, V03, V02, V01, and V00) are selected.

Note that a difference between intermediate voltages and a difference between an intermediate voltage and a reference voltage are preferably 1/20 to 1/4 of a difference between reference voltages and are set to, e.g., 1/10 of a difference between reference voltages. That is, if (V32−V27) is 2 V, (V32−V31)=(V31−V30)=(V29−V28)=(V28−V27)=0.2 V. If the differences fall within the above-described range, high-accuracy decoding can be performed.

Note that number of intermediate voltages in one voltage set may be 2, the number is preferably 4 for higher-accuracy reading, as described above. In other words, one voltage set is preferably composed of five voltages of a reference voltage, two intermediate voltages lower than the reference voltage, and two intermediate voltages higher than the reference voltage.

<Step S15> Application of SB Read Voltage

The word line controlling section 21 applies the voltages of the selected voltage set to the memory cells. For example, when the L bit is to be read, a voltage set which is composed of the voltages V19, V18, V17, V16, and V15 is applied to the memory cells.

As described above, in the memory card 3 and the decoding method according to the embodiment, read voltages (intermediate voltages) required to read SBs indicating the degree of certainty of each HB may be only four ones near a reference voltage for reading the HB, unlike the comparative example described above.

<Step S16> Soft-Decision Decoding

Soft-decision decoding is performed using LLRs stored in the log likelihood ratio table storing section 22 on a basis of read SBs.

For example, in the example for L bits shown in FIG. 4, soft-decision decoding is performed using LLR-L corresponding to 5-bit data composed of HB-L, SB-L1, SB-L2, SB-L3, and SB-L4 as an initial LLR.

In the soft-decision decoding, iterative calculation based on probability is performed using an LDPC code on a per-ECC-frame basis, i.e., on a per-data-sequence basis (a data sequence is composed of a plurality of pieces of 1-bit data read from a plurality of memory cells). The LDPC code is a linear code defined by a very sparse check matrix, i.e., a check matrix with very few non-zero elements and is a code defined by a Tanner graph. Updates are made by exchanging results of local inference on the Tanner graph. For example, according to SPA (the sum-product algorithm), pieces of information are passed between check nodes and bit nodes on a basis of an initial LLR, information at each node is updated, and hard-decision and parity checking are performed using an LLR after the update. If a result of the parity checking is NG, exchange of information between the nodes, hard-decision, and parity checking are repeated until a predetermined number of times are reached.

<Step S17> Parity Checking

If a result of the parity checking is OK, decoded data is transmitted to the host 4 via the host I/F in S18.

On the other hand, if the result of the parity checking is NG, an error message is transmitted to the host 4 via the host I/F in S19.

Note that although the SB reading in S14 and S15 is performed after the parity checking by hard-decision decoding in S13 in the above description, HB reading and SB reading may be simultaneously performed in parallel. In the case as well, if a result of the parity checking by hard-decision decoding is NG, soft-decision decoding is performed from S16.

At a time of the SB read voltage application in S15, the reference voltage(s) for HB reading may be applied again to the memory cells or a result of the reading in S11 may be used. A plurality of read voltages may be applied from lowest to highest or may be randomly applied.

As in the above description, the memory card 3 according to the first embodiment is a semiconductor memory device including:

the memory cell 13D configured to store N (N is a natural number not less than 2) bits of data including a first bit (L bit) and a second bit (M bit);

the word line 13E configured to apply a read voltage to the memory cell 13D;

the word line controlling section 21 configured to perform control to apply the read voltage to the word line 13E to read data from the memory cell 13D;

the log likelihood ratio table storing section 22 configured to store a log likelihood ratio based on each of the read voltages; and the decoder 1 configured to receive data read by the read voltage applied to the word line 13E, wherein the word line controlling section 21 applies a first reference potential (V17) to the word line 13E to read a first hard bit when the first bit (L bit) is to be read and applies a second reference potential (V07) lower than the first reference potential and a third reference potential higher than the first reference potential to the word line 13E to read a second hard bit when the second bit (M bit) is to be read, the word line controlling section 21 applies a first intermediate potential (V05) lower than the second reference potential, a second intermediate potential (V09) higher than the second reference potential, a third intermediate potential (V25) higher than the second intermediate potential and lower than the third reference potential, and a fourth intermediate potential (V29) higher than the third reference potential to the word line 13E to read a soft bit when the word line controlling section 21 reads the second bit (M bit), the decoder 1 decodes the second bit (M bit) using one of the log likelihood ratios corresponding to the soft bit, a difference between the second intermediate potential (V09) and the first reference potential (V17) is larger than a difference between the second intermediate potential (V09) and the second reference potential (V07), a difference between the third intermediate potential (V25) and the first reference potential (V17) is larger than a difference between the third intermediate potential (V25) and the third reference potential (V27), and the decoder 1 decodes the second bit using a same log likelihood ratio if a memory cell threshold voltage Vth is between the second intermediate potential and the third intermediate potential.

The read voltages for reading the second bit (M bit) need not be applied when the first bit (L bit) is read, and the read voltage for reading the first bit (L bit) need not be applied when the second bit (M bit) is read.

In the memory card 3 described above, the word line controlling section 21 preferably applies a fifth intermediate potential (V06) higher than the first intermediate potential and lower than the second reference potential, a sixth intermediate potential (V08) higher than the second reference potential and lower than the second intermediate potential, a seventh intermediate potential (V26) higher than the third intermediate potential and lower than the third reference potential, and an eighth intermediate potential (V28) higher than the third reference potential and lower than the fourth intermediate potential, in addition to the first to fourth intermediate potentials, to read the soft bit.

In the memory card 3, the decoder 1 preferably decodes the read second bit by a method different from the decoding using a log likelihood ratio (soft-decision decoding).

In the memory card 3, if an error in the second bit cannot be corrected as a result of performing decoding (hard-decision decoding) by a method different from the decoding using a log likelihood ratio, the decoder preferably performs the decoding using a log likelihood ratio (soft-decision decoding).

Note that, in the memory card 3, 36-level reading by applying the thirty-five voltages is required to read all pieces of bit data for L, M, and U (3-bit data). However, if data which has been read a large number of times is stored as an L bit, reading of three bits of data requires 6-level reading by application of five voltages to be performed only three times, i.e., requires only 18-level reading by application of fifteen voltages.

The decoding speed of the memory card 3 is thus high. That is, the decoding method according to the embodiment has a high processing speed.

Second Embodiment

A memory card 3A and a decoding method according to a second embodiment of the present invention will be described below with reference to the drawings. The memory card 3A and the decoding method according to the present embodiment are similar to the memory card 3 and the decoding method according to the first embodiment, and a description of same components will be omitted.

Figure 6:
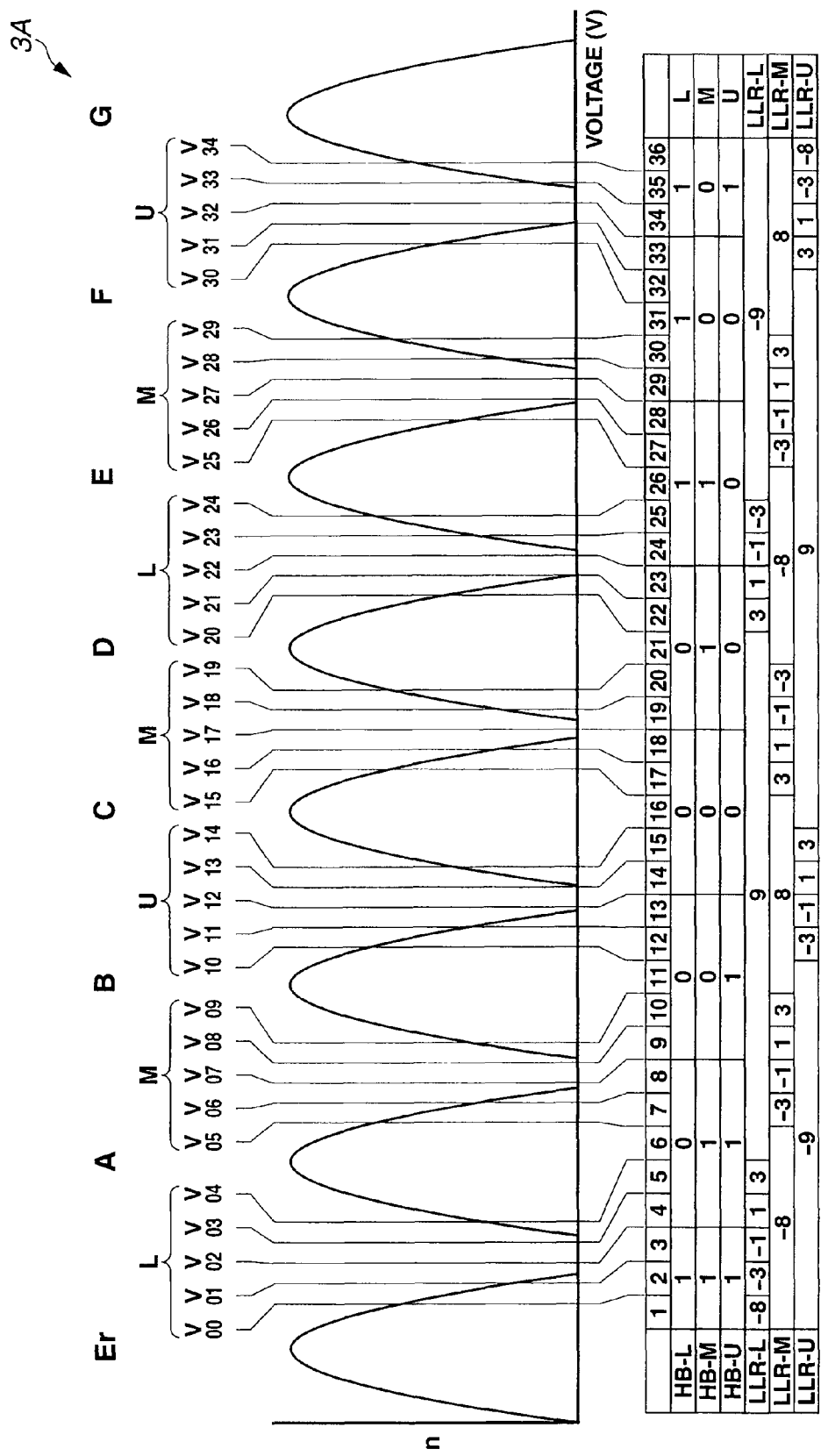
FIG. 6 is an explanatory chart showing a relationship among threshold voltage distributions, stored pieces of data, and a log likelihood ratio table for explaining soft-decision decoding in a memory card according to a second embodiment.

As shown in FIG. 6, in the memory card 3A, numbers of voltage sets required to read three pieces of 1-bit data stored in each memory cell and belonging to difference pages, each being a unit of reading, are more even. That is, the numbers of voltage sets required to decode N pieces of 1-bit data stored in each memory cell are more even in the memory card 3A.

In the memory card 3A, a word line controlling section 21 performs control to apply voltages of two voltage sets (V24 to V20 and V04 to V00) at a time of L bit reading, voltages of three voltage sets (V29 to V25, V19 to V15, and V09 to V05) at a time of M bit reading, and voltages of two voltage sets (V34 to V30 and V14 to V10) at a time of U bit reading as read voltages to each memory cell.

The method for reading the memory card 3 described above will be referred to as 1-2-4 code, and a method for reading the memory card 3A will be referred to as 2-3-2 code.

In 1-2-4 code, number of voltage sets required to read an L bit out of 3-bit data stored in each memory cell is 1, number of voltage sets required to read an M bit is 2, and number of voltage sets required to read a U bit is 4. That is, a difference between the number (4) of voltage sets required to read the U bit that is largest and the number (1) of voltage sets required to read the L bit that is smallest is 3.

In contrast, in 2-3-2 code, number of voltage sets required to read an L bit is 2, number of voltage sets required to read an M bit is 3, and number of voltage sets required to read a U bit is 2. That is, a difference between the number (3) of voltage sets required to read the M bit that is largest and the number (2) of voltage sets required to read the L bit that is smallest is 1.

The numbers of voltage sets required to read pages are more even in the memory card 3A than in the memory card 3.

In a NAND flash memory card, if N (N is a natural number not less than 2) bits of data to be stored in one multi-level memory cell are stored to have $2^N$ threshold voltage distributions, bit data stored later has a higher error rate than bit data stored earlier.

In contrast, in 2-3-2 code of the memory card 3A, error rates for pages are averaged by averaging the numbers of read voltage sets required to read the pages.

In other words, in 2-3-2 code, an error rate for U bits decreases significantly while error rates for L bits and M bits increase, compared to 1-2-4 code. A difference in error rate between a page (for a U bit) with a highest error rate and a page (for an L bit) with a lowest error rate is thus smaller. For this reason, overall reliability of the memory card is improved.

As described above, the memory card 3A reads and decodes three bits of data composed of first bit data to be stored first in each memory cell, second bit data to be stored next, and third bit data to be stored last on per-1-bit-data basis.

In the voltage applying process, the word line controlling section 21 performs control to apply voltages of two voltage sets at a time of reading (decoding) of the first bit data, voltages of three voltage sets at a time of reading (decoding) of the second bit data, and voltages of two voltage sets at a time of reading (decoding) of the third bit data as read voltages to each memory cell.

In the memory card 3A and the decoding method according to the present embodiment, error rates for pages are more even, in addition to advantages of the memory card 3 and the like.

Third Embodiment

A memory card 313 and a decoding method according to a third embodiment of the present invention will be described below with reference to the drawings. The memory card 3B and the decoding method are similar to the memory card 3A and the like according to the second embodiment, and a description of same components will be omitted.

Figure 7:
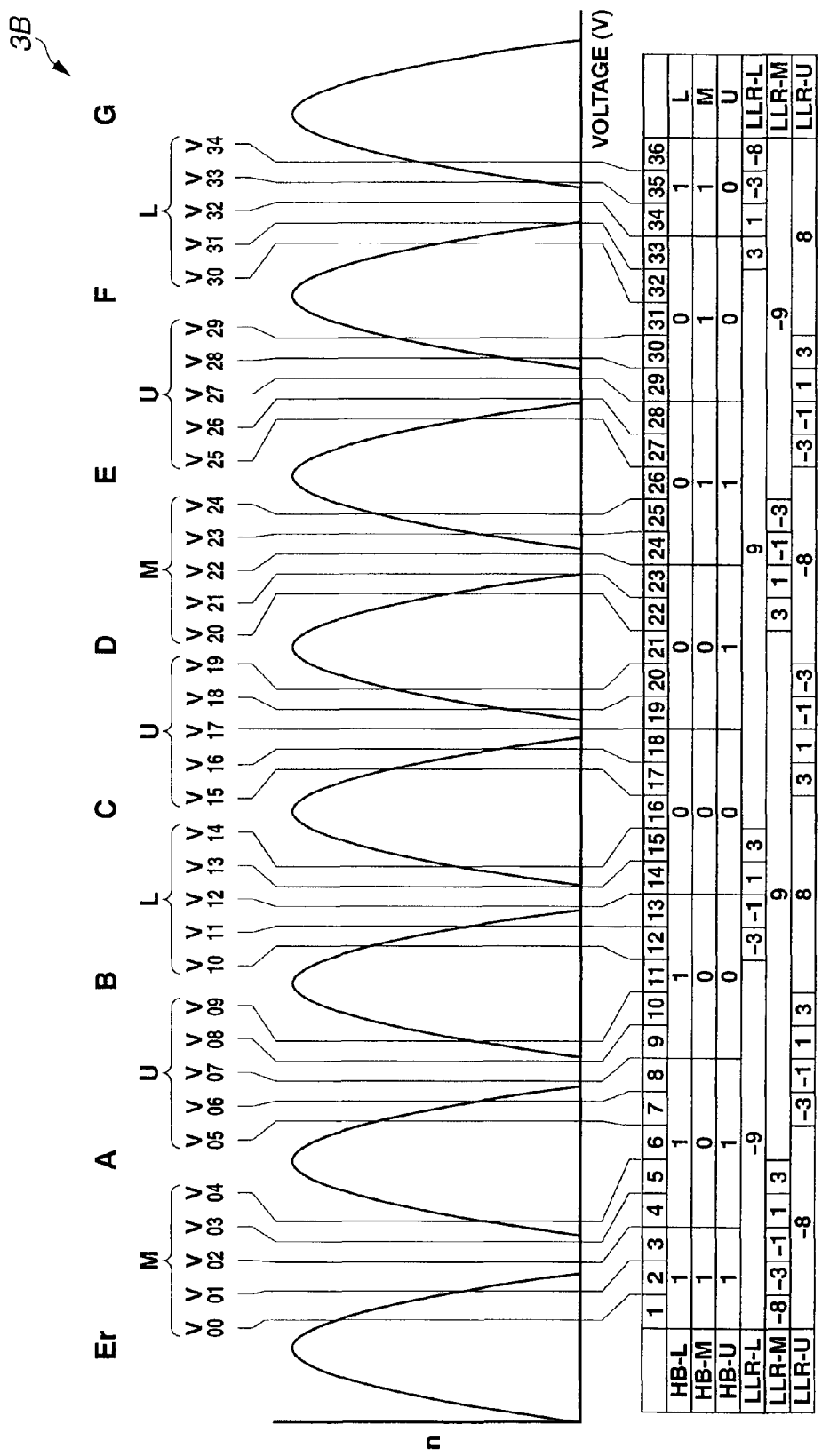
FIG. 7 is an explanatory chart showing a relationship among threshold voltage distributions, stored pieces of data, and a log likelihood ratio table for explaining soft-decision decoding in a memory card according to a third embodiment.

As shown in FIG. 7, a method for reading the memory card 3B is 2-2-3 code in which a word line controlling section 21 performs control to apply voltages of two voltage sets (V34 to V30 and V14 to V10) at the time of L bit reading, voltages of two voltage sets (V24 to V20 and V04 to V00) at the time of M bit reading, and voltages of three voltage sets (V29 to V25, V19 to V15, and V09 to V05) at the time of U bit reading as read voltages to each memory cell.

That is, in the memory card 3B, the word line controlling section 21 reads three bits of data composed of first bit data to be stored first in each memory cell, second bit data to be stored next, and third bit data to be stored last on per-1-bit-data basis. In a voltage applying process, the word line controlling section 21 performs control to apply the voltages of the two voltage sets at the time of reading the first bit data, the voltages of the two voltage sets at the time of reading the second bit data, and the voltages of the three voltage sets at the time of reading the third bit data and performs decoding.

In 2-2-3 code, numbers of voltage sets are averaged, like 2-3-2 code for the memory card 3A. Note that 3-2-2 code can also make numbers of voltage sets more even.

The memory card 3B is different from the memory card 3A in how the voltages V00 and V01 are set. Data stored for level Er with lowest voltages has a high probability of being erroneously read as data stored for level A.

For this reason, the intermediate voltages V00 to V04 are set such that (V02−V01)=(V01−V00)>(V03−V02)=(V04−V03).

That is, in the memory card 3B, a difference between intermediate voltages in a region with a high error rate is set to be larger than differences in other regions, i.e., intermediate voltages are unevenly set in order to reduce an error rate at a time of reading by a voltage set with lowest threshold voltages.

In the memory card 3B and the decoding method according to the present embodiment, an error rate at the time of reading by the voltage set with the lowest threshold voltages is low, in addition to advantages of the memory card 3A and the like.

Note that intermediate voltages may be unevenly set in the memory cards 3 and 3A or the decoding methods according to the first and second embodiments, like the memory card 3B or the decoding method according to the third embodiment.

Fourth Embodiment

A memory card 3C and a decoding method according to a fourth embodiment of the present invention will be described below with reference to the drawings. The memory card 3C and the decoding method are similar to the memory card 3 and the like according to the first embodiment, and a description of same components will be omitted.

Figure 8:
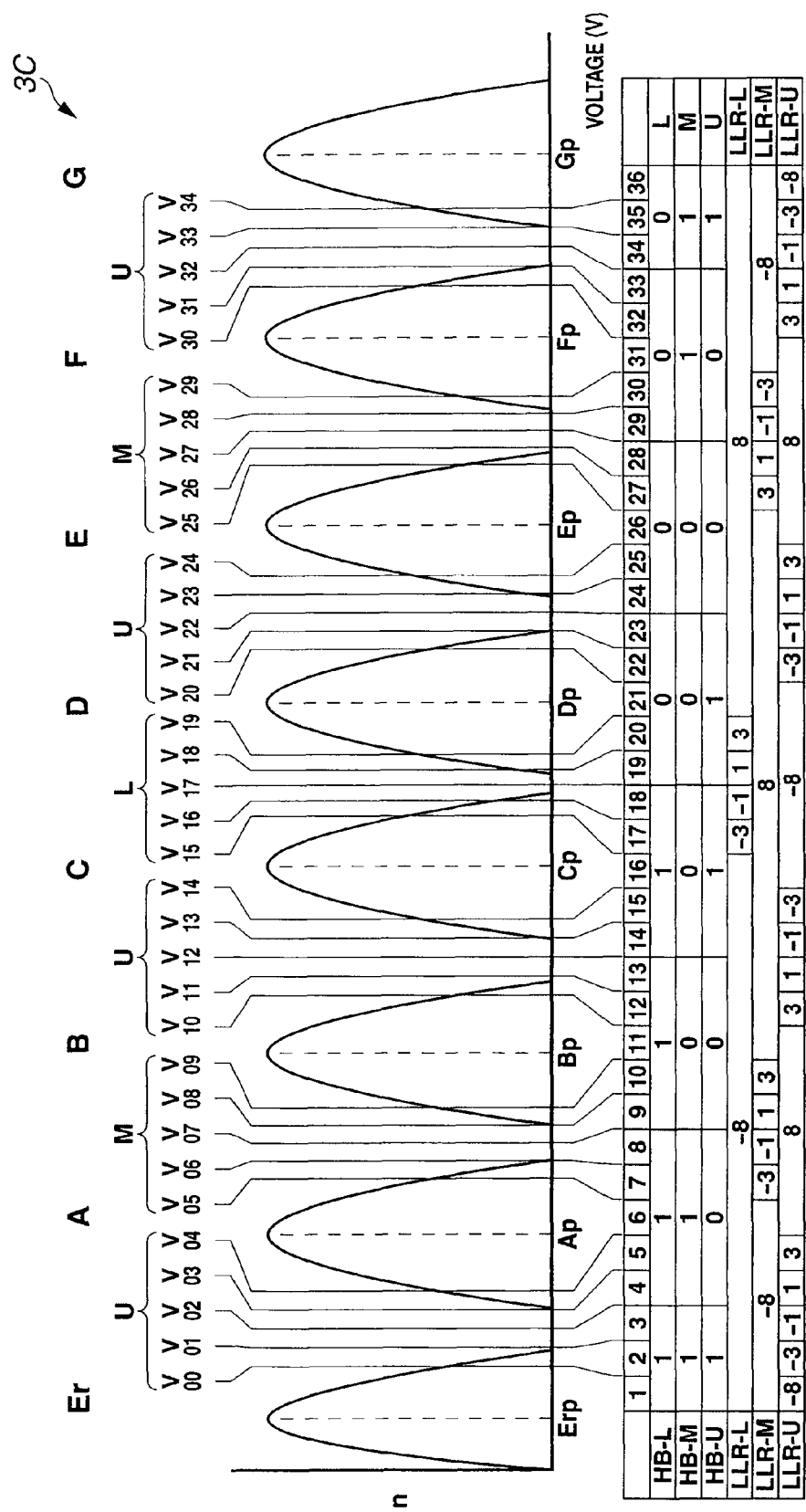
FIG. 8 is an explanatory chart showing a relationship among threshold voltage distributions, stored pieces of data, and a log likelihood ratio table for explaining soft-decision decoding in a memory card according to a fourth embodiment.

As shown in FIG. 8, the decoding method for the memory card 3C is same as the decoding method for the memory card 3, 1-2-4 code. As described above, in the memory card 3 with 1-2-4 code, an error rate for L bits stored first is lowest, and an error rate for U bits stored last is highest.

However, in the memory card 3C, reference voltages and intermediate voltage are set so as to average error rates for three pieces of 1-bit data stored in each memory cell and belonging to different pages, each being a unit of reading, i.e., error rates for the pages.

That is, in the memory card 3C, $(2^N-1)$ reference voltages are set so as to average error rates for N pieces of 1-bit data. In the memory card 3C, intermediate voltages are also set so as to average the error rates for the N pieces of 1-bit data. In the memory card 3C, a voltage set is composed of a reference voltage, two intermediate voltages lower than the reference voltage, and two intermediate voltages higher than the reference voltage.

In the memory card 3C, a difference between intermediate voltages in an L bit read voltage set (V19 to V15) is smaller than differences between intermediate voltages in M bit read voltage sets (V29 to V25 and V09 to V05), and differences between intermediate voltages in U bit read voltage sets (V34 to V30, V24 to V20, V14 to V10, and V04 to V00) are larger than the differences between the intermediate voltages in the M bit read voltage sets (V29 to V25 and V09 to V05).

For example, (V19−V18)=0.9×(V29−V28), and (V34−V33)=1.1×(V29−V28). The voltage differences are appropriately set.

A voltage difference (Dp−Cp) between a peak voltage Cp of a distribution C and a peak voltage Dp of a distribution D which serves as a benchmark for an FIB read voltage for L bits is smaller than a voltage difference (Ep−Fp) between a peak voltage Ep of a distribution E and a peak voltage Fp of a distribution F and a voltage difference (Bp−Ap) between a peak voltage Bp of a distribution B and a peak voltage Ap of a distribution A which serve as benchmarks for HB read voltages for M bits.

A voltage difference (Gp−Fp) between a peak voltage Gp of a distribution G and the peak voltage Fp of the distribution F and other voltage differences which serve as benchmarks for HB read voltages for U bits are larger than the voltage difference (Bp−Ap).

Accordingly, voltage differences between reference voltages are uneven.

For example, (Dp−Cp)=0.9×(Ep−Fp)=0.9×(Bp−Ap), and (Gp−Fp)=(Ep−Dp)=(Cp−Bp)=(Ap−Erp)=1.1×(Ep−Fp).

That is, in the memory card 3C, a difference between read voltages of a read voltage set is set to be larger in a region with a higher error rate so as to average error rates for three pieces of 1-bit data stored in each memory cell and belonging to difference pages, each being a unit of reading, i.e., error rates for the pages. In other words, reference voltages and intermediate voltages are unevenly set.

For this reason, in the memory card 3C and the decoding method according to the present embodiment, error rates are averaged, in addition to the advantages of the memory card 3.

Note that, in the memory card 3C and the decoding method according to the present embodiment as well, the intermediate voltages may be unevenly set in order to reduce an error rate at the time of reading by a voltage set with lowest threshold voltages, like the memory card 3B and the like.

In the memory cards 3A and 3B and the decoding methods according to the embodiments as well, the reference voltages and the intermediate voltages may be unevenly set so as to average error rates for three pieces of 1-bit data stored in each memory cell and belonging to different pages, like the memory card 3C and the like.

Note that although the above-described embodiments have been described in a context of the memory card 3 and the like with memory cells, each storing 3-bit data (N=3), same applies to a memory card with memory cells, each storing 4-bit data (N=4). That is, N is not less than 2, and advantages of the present invention can be achieved if N is not less than 3 or if N is not less than 4. An upper limit for N is not more than 7 from a standpoint of industrial practice.

The present invention is not limited to an LDPC code, and any other codes may be adopted as long as the codes are decoded by iterative calculation based on probability. Any decoding algorithm such as sum-product decoding, min-sum decoding, or normalized min-sum decoding may be used.

The above description has been given in a context of the memory card 3 or the like connected to the host 4 as a semiconductor memory device. Even a so-called embedded NAND flash memory device which is housed in the host 4 and on which data for starting up the host 4 and the like are recorded, an SSD (Solid State Drive) which is a semiconductor disk, or the like can achieve same advantages as the advantages of the memory card 3 and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a word line controlling section configured to, when N (N is a natural number not less than 2) bits of data stored in one memory cell and belonging to different pages, each page being a unit of reading, are decoded by iterative calculation using probability based on $2^N$ threshold voltage distributions, select a voltage set required to read 1-bit data belonging to a page to be read from among $(2^N-1)$ voltage sets, each set being composed of a reference voltage for hard bit reading and a plurality of intermediate voltages including a voltage lower than the reference voltage and a voltage higher than the reference voltage for soft bit reading and perform control to apply the voltages of the selected voltage set as read voltages to the memory cell;
a log likelihood ratio table storing section configured to store a log likelihood ratio based on each of the read voltages; and
a decoder configured to decode the data read by the read voltages which are applied by the word line controlling section using the log likelihood ratios stored in the log likelihood ratio table storing section and corresponding to the read voltages.

2. The semiconductor memory device according to claim 1, wherein
the read voltages are set to average error rates for N pieces of the 1-bit data stored in the one memory cell.

3. The semiconductor memory device according to claim 2, wherein
a number of the voltage sets which are required to decode each of the N pieces of the 1-bit data stored in the one memory cell is averaged.

4. The semiconductor memory device according to claim 3, wherein
three bits of the data composed of first bit data to be stored first in the one memory cell, second bit data to be stored next, and third bit data to be stored last, are decoded 1-bit data at a time, and
the word line controlling section performs control to apply the voltages of two of the voltage sets for the decoding of the first bit data, the voltages of three of the voltage sets for the decoding of the second bit data, and the voltages of two of the voltage sets for the decoding of the third bit data as the read voltages to the memory cell.

5. The semiconductor memory device according to claim 3, wherein
three bits of the data composed of first bit data to be stored first in the one memory cell, second bit data to be stored next, and third bit data to be stored last, are decoded 1-bit data at a time, and
the word line controlling section performs control to apply the voltages of two of the voltage sets for the decoding of the first bit data, the voltages of two of the voltage sets for the decoding of the second bit data, and the voltages of three of the voltage sets for the decoding of the third bit data.

6. The semiconductor memory device according to claim 5, wherein
the $(2^N-1)$ reference voltages are set to average the error rates for N pieces of the 1-bit data.

7. The semiconductor memory device according to claim 6, wherein
the intermediate voltages are set to average the error rates for N pieces of the 1-bit data.

8. The semiconductor memory device according to claim 7, wherein
each of the voltage sets is composed of the reference voltage, two intermediate voltages lower than the reference voltage, and two intermediate voltages higher than the reference voltage.

9. The semiconductor memory device according to claim 8, wherein
the decoding is decoding using an LDPC code,
the memory cell is a NAND flash memory cell, and
the N pieces of 1-bit data stored in the one memory cell belong to different pages, each page being a unit of reading.

10. A decoding method comprising:
when N (N is a natural number not less than 2) bits of data stored in one memory cell of a semiconductor memory device and belonging to different pages, each page being a unit of reading, are decoded on a per-page basis by iterative calculation using probability based on $2^N$ threshold voltage distributions,
selecting a voltage set required to read 1-bit data of the N bits of data belonging to one of the pages to be read from among $(2^N-1)$ voltage sets, each set being composed of one of ($2^N$−1) reference voltages for hard bit reading and a plurality of intermediate voltages including a voltage lower than the reference voltage and a voltage higher than the reference voltage for soft bit reading, and applying the voltages of the selected voltage set as read voltages to the memory cell; and decoding the data read by the read voltages which are applied to the memory cell using log likelihood ratios stored in a log likelihood ratio table storing section configured to store a log likelihood ratio based on each of the read voltages.

11. The decoding method according to claim 10, wherein the read voltages are set to average error rates for N pieces of the 1-bit data stored in the one memory cell.

12. The decoding method according to claim 11, wherein a number of the voltage sets which are required to decode each of the N pieces of the 1-bit data stored in the one memory cell is averaged.

13. The decoding method according to claim 12, further comprising:

decoding three bits of the data composed of first bit data to be stored first in the one memory cell, second bit data to be stored next, and third bit data to be stored last 1-bit data at a time; and applying the voltages of two of the voltage sets for the decoding of the first bit data, the voltages of three of the voltage sets for the decoding of the second bit data, and the voltages of two of the voltage sets for the decoding of the third bit data as the read voltages to the memory cell in the voltage application.

14. The decoding method according to claim 12, further comprising:

decoding three bits of the data composed of first bit data to be stored first in the one memory cell, second bit data to be stored next, and third bit data to be stored last 1-bit data at a time; and applying the voltages of two of the voltage sets for the decoding of the first bit data, the voltages of two of the voltage sets for the decoding of the second bit data, and the voltages of three of the voltage sets for the decoding of the third bit data in the voltage application.

15. The decoding method according to claim 14, wherein the ($2^N$−1) reference voltages are set to average the error rates for N pieces of the 1-bit data.

16. The decoding method according to claim 15, wherein the intermediate voltages are set to average the error rates for N pieces of the 1-bit data.

17. The decoding method according to claim 16, wherein each of the voltage sets is composed of the reference voltage, two intermediate voltages lower than the reference voltage, and two intermediate voltages higher than the reference voltage.

18. The decoding method according to claim 17, wherein the decoding is decoding using an LDPC code, the memory cell is a NAND flash memory cell, and the N pieces of 1-bit data stored in the one memory cell belong to different pages, each page being a unit of reading.

19. A semiconductor memory device comprising:

a memory cell configured to store N (N is a natural number not less than 2) bits of data including a first bit and a second bit;

a word line configured to apply a read voltage to the memory cell;

a word line controlling section configured to perform control to apply the read voltage to the word line in order to read data from the memory cell;

a log likelihood ratio table storing section configured to store a log likelihood ratio based on each of the read voltages; and a decoder configured to receive the data read by the read voltage which is applied to the word line, wherein the word line controlling section applies a first reference potential to the word line to read a first hard bit when the first bit is to be read and applies a second reference potential lower than the first reference potential and a third reference potential higher than the first reference potential to the word line to read a second hard bit when the second bit is to be read, the word line controlling section applies a first intermediate potential lower than the second reference potential, a second intermediate potential higher than the second reference potential, a third intermediate potential higher than the second intermediate potential and lower than the third reference potential, and a fourth intermediate potential higher than the third reference potential to the word line to read a soft bit when the second bit is to be read, the decoder decodes the second bit using a log likelihood ratio corresponding to the soft bit, a difference between the second intermediate potential and the first reference potential is larger than a difference between the second intermediate potential and the second reference potential, a difference between the third intermediate potential and the first reference potential is larger than a difference between the third intermediate potential and the third reference potential, and the decoder decodes the second bit using the same log likelihood ratio if a threshold voltage for the memory cell is between the second intermediate potential and the third intermediate potential.

* * * * *